United States Patent
Nakahata et al.

[11] Patent Number: 6,100,606
[45] Date of Patent: Aug. 8, 2000

[54] HIGH FREQUENCY SWITCHING DEVICE

[75] Inventors: Atsushi Nakahata, Matsusaka; Shigeyuki Okumura, Taki-gun; Tomohiro Taguchi, Watarai-gun, all of Japan

[73] Assignee: Matsushita Electric Works, Ltd., Osaka, Japan

[21] Appl. No.: 09/225,495

[22] Filed: Jan. 6, 1999

[30] Foreign Application Priority Data

| Jan. 27, 1998 | [JP] | Japan | 10-013641 |
| Jan. 30, 1998 | [JP] | Japan | 10-019541 |
| Jan. 30, 1998 | [JP] | Japan | 10-019542 |
| May 29, 1998 | [JP] | Japan | 10-149077 |

[51] Int. Cl.[7] ................................................. H03K 17/04
[52] U.S. Cl. ........................... 307/91; 307/129; 200/305; 363/39
[58] Field of Search ........................... 307/91, 105, 129; 200/504, 305; 333/202; 363/39, 21; 370/FOR 105, 357; 455/199.1

[56] References Cited

U.S. PATENT DOCUMENTS

| 3,686,455 | 8/1972 | Sonnberger | 200/504 |
| 5,049,707 | 9/1991 | Kameya | 200/305 |
| 5,473,293 | 12/1995 | Chigodo et al. | 333/104 |
| 5,625,177 | 4/1997 | Yukinori et al. | 333/262 |
| 5,742,103 | 4/1998 | Ashok | 363/39 |
| 5,757,628 | 5/1998 | Kamata | 363/21 |

*Primary Examiner*—Albert W. Paladini
*Attorney, Agent, or Firm*—Arent, Fox, Kintner, Plotkin & Kahn, PLLC

[57] ABSTRACT

A miniaturized high frequency switching device is capable of giving an optimum over-all impedance over the length of a signal path while compensating for inevitable impedance variation seen in a particular segment of the signal path. The switching device includes a contact block having fixed contacts and a movable contact. The fixed contacts and the movable contact are surrounded by an electromagnetic shield which is supported on a conductor base to be grounded therethrough for isolating the current path from a surrounding electromagnetic field. The fixed contacts are formed respectively on one ends of terminal pins provided for electrical connection to an external load circuit operating on high frequency signals. The terminal pin extends through an insulation ring fitted in the conductor base so as to be electrically insulated therefrom and form the signal path flowing a high frequency current. An impedance compensating structure is provided in the contact block for differentiating a first impedance at a first segment of a limited length along the terminal pin from a second impedance inherent to a second segment immediately adjacent the first segment so as to give a target over-all impedance, which is between the first and second impedance, over the full length of the terminal pin.

10 Claims, 5 Drawing Sheets

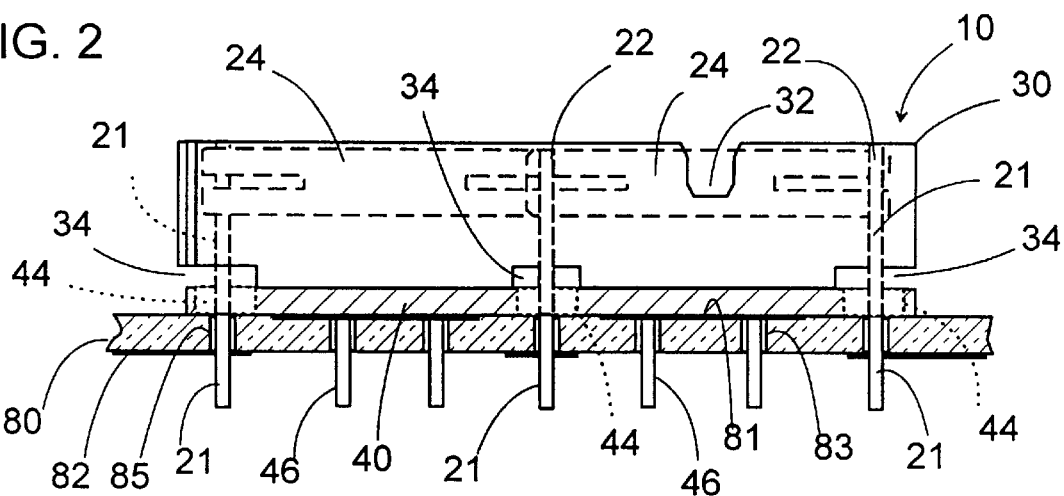
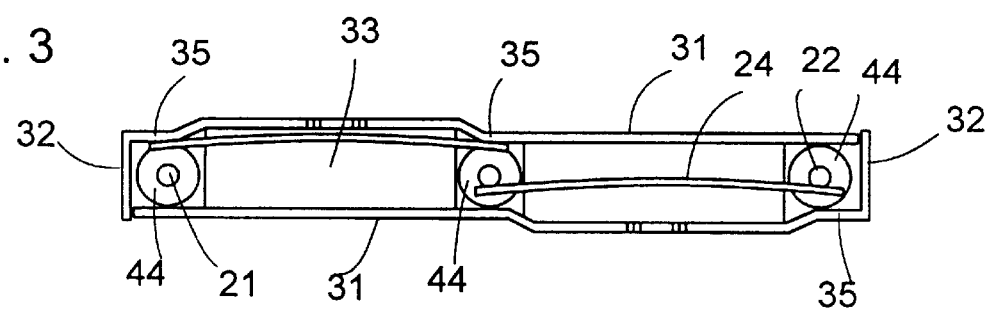
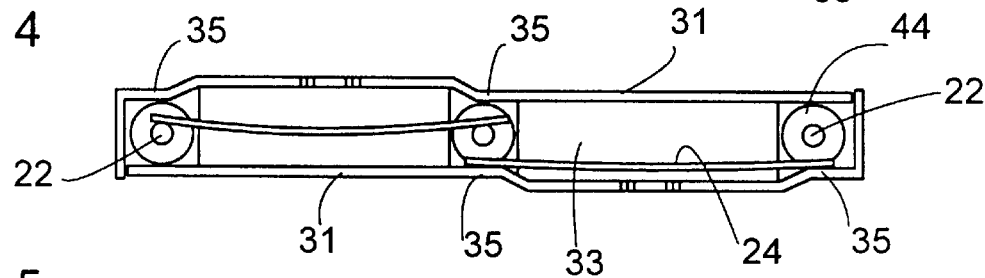
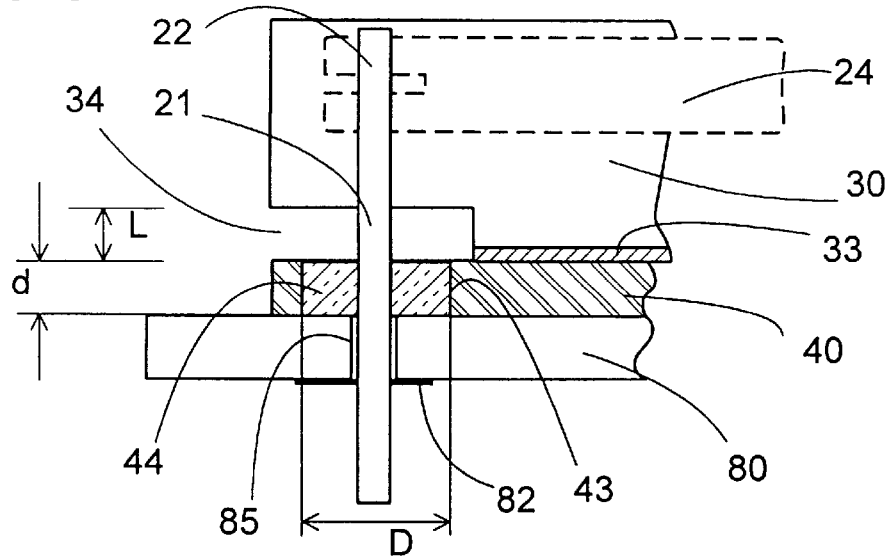

HIGH FREQUENCY SWITCHING DEVICE

BACKGROUND OF THE INVENTION

1. Field of the Invention

The present invention is directed to a high frequency switching device, and more particularly to a miniature switching device such as a relay for switching high frequency signals.

2. Description of the Prior Art

A known high frequency switching device has a contact block having fixed contacts and a movable contact which is driven to open and close a current path between the fixed contacts. In order to isolate the current path from a surrounding electromagnetic field, the fixed contacts and the movable contact are surrounded by an electromagnetic shield which is supported on a conductor base and is grounded therethrough. The fixed contacts are formed respectively on one ends of terminal pins provided for electrical connection to an external load circuit operating on high frequency signals. The terminal pin extends through an insulation ring fitted in the conductor base so as to be electrically insulated therefrom. Retaining this structure for high frequency use, the device has been demanded to be made compact enough to be incorporated into small electronic devices, such as portable cellular phones, while retaining minimum return loss, i.e., having VSWR as nearly to unity as possible. In order to achieve miniaturization of the device while keeping an optimum over-all impedance of about 50Ω along a signal path of the high frequency current, however, it should be taken into account that a short segment of the terminal pin passing through the insulation ring is restricted to have a specific impedance (Z) expressed in the following equation.

$$Z = \frac{138}{\sqrt{\varepsilon_r}} \log \frac{D}{d}$$

where $\varepsilon_r$ is a dielectric constant of the insulation ring.

Therefore, provided that the terminal pin is uniform in diameter along its length, the signal path along the terminal pin suffers from varying impedance at this particular segment surrounded by the insulation ring. In fact, the impedance at this segment will be considerably lowered with respect to the other portion of the signal path. Although it is possible to adjust the impedance (Z) at this segment to the optimum impedance of about 50 Ω by suitably selecting dielectric constant $\varepsilon_r$, thickness (d) of the base and diameter (D) of the insulation ring, all the attempts are found not practically acceptable for the following reasons. Firstly, the dielectric constant $\varepsilon_r$ is substantially fixed because of limited availability of the dielectric material as the insulation ring. Secondly, the thickness (d) of the conductor base should not be made so small in order to retain mechanical strength. Thirdly, the diameter (D) should not be made so large as to be consistent with the miniaturization of the device. Consequently, no effective scheme has been found to combine the miniaturization of the relay and the over-all optimum impedance of the signal path.

SUMMARY OF THE INVENTION

In view of the above problem, the present invention has been achieved to provide a miniaturized high frequency switching device which is capable of giving an optimum over-all impedance over the length of a signal path while compensating for inevitable impedance variation seen in a particular segment of the signal path. The switching device of the present invention includes a contact block having fixed contacts and a movable contact which is driven to open and close a current path between the fixed contacts. The fixed contacts and the movable contact are surrounded by an electromagnetic shield which is supported on a conductor base to be grounded therethrough for isolating the current path from a surrounding electromagnetic field. The fixed contacts are formed respectively on one ends of terminal pins provided for electrical connection to an external load circuit operating on high frequency signals. The terminal pin extends through an insulation ring fitted in the conductor base so as to be electrically insulated therefrom and form a signal path flowing a high frequency current. An impedance compensating structure is provided in the contact block for differentiating a first impedance at a first segment of a limited length along the terminal pin from a second impedance inherent to a second segment immediately adjacent the first segment so as to give a target over-all impedance, which is between the first and second impedances, over the full length of the terminal pin. The above compensation is validated to give an optimum over-all impedance based upon the finding that a variation of the impedance at a first segment of limited length along the signal path can be successfully compensated by counter-variation of impedance at an immediately adjacent second segment of also limited length, specifically when the two segments are of the length not greater than one hundredth of a wavelength λ for the high frequency current.

In a preferred embodiment, the impedance compensating structure is realized by a cut-out which is formed in the shield immediately adjacent to the conductor base to give an open window located around the terminal pin for increasing the first impedance at the first segment corresponding to the cut-out, beyond the target optimum over-all impedance. More specifically, the cut-out gives the first impedance at the first segment which is greater than the second impedance given to second segment of the terminal pin surrounded by the insulation ring.

The conductor base is formed with through-holes into each of which the insulation ring fits snugly with upper and lower surfaces of the insulation ring being in flush with the upper and lower surfaces of the conductor base. It is preferred that the conductor base has a thickness (d) which is smaller than a diameter (D) of the insulation ring in order to minimize the reduction of the second impedance at the second segment, enabling easy impedance compensation by the cut-out.

The electromagnetic shield has side walls which enclose therebetween the fixed contacts as well as the movable contact. The side walls may be shaped from a metal sheet of uniform thickness and formed at portions respectively adjacent the fixed contacts with flattened shoulders on which opposite ends of the movable contact rest when the movable contact is in an open condition. Each of the flattened shoulders is shaped by partially deforming the side wall inwardly over a limited length in parallel with the movable contact so that the movable contact has its opposite ends in constant contact with the shoulders over substantially the entire length thereof when the movable contact is in the open condition. Thus, the end of the movable contact is kept as close as possible to the side wall of the shield in the open position so as not to make itself a floating electrode which would otherwise see a ground current in the open condition and bring about an antenna effect of lessening the isolation of the fixed contacts from the ground. Consequently, the isolation can be improved by provision of the flattened shoulders which are shaped easily from the shield.

Further, it is also preferred that the conductor base has first and lower surfaces of different levels. The second surface is adapted in use to be surface mounted on a printed board so as to be electrically connected to a ground conductor on top of the printed board. The second lower surfaces are provided to pass the terminal pins therethrough and is positioned in a level higher than the first lower surface so as to form a clearance between the second lower surface and the printed board. The clearance enables the terminal pins to be soldered on a conductor circuit on top of the printed board. Consequently, the contact block of this configuration can be successfully surface-mounted on the printed board having the ground conductor and the conductor circuit both on top of the board. In addition, the clearance may be effective to compensate for the above impedance reduction at the second segment of the terminal pin surrounded by the insulation ring in cooperation with the cut-out so as to provide an optimum over-all impedance for the terminal pin. Because of that the high frequency current will flow through an upper segment of each fixed contact only located above the printed board and not through a lower segment of the fixed contact terminal thereunder, the fixed contact terminals can have the individual upper segments of uniform length measured from the conductor base to the soldering connections so that the impedance of the upper segments can be made uniform for easy impedance matching in designing the over-all optimum impedance.

Preferably, the conductor base carries a plurality of ground pins for connection with the ground conductor on the printed board. Each of the ground pins is formed at its upper end with an enlarged head and extends through a corresponding through-hole in the conductor base with the enlarged head being engaged with an inner flange formed at the lower end of the through-hole. The enlarged head is secured to the inner flange by a solder filled in the through-hole at a portion adjacent to the inner flange. Thus, a portion of the solder utilized for connection of the terminal pin to the base can be melted upon mounting of the conductor base on the printed board to make a soldering connection of the terminal pin to the circuit board for reliable electrical connection between the conductor base and the printed board.

The contact block of the above structure can be incorporated in an electromagnetic relay including an electromagnet block which carries an excitation coil and an armature. The armature is coupled to open and close the movable contact from and to the fixed contacts upon energization of the excitation coil. A casing is provided to receive the electromagnet block as well as the contact block. The casing is molded from an electrically insulating plastic material and is deposited thereon with a ground layer of electrically conductive material. The electromagnetic block includes parts of electrically conductive material which are exposed on the electromagnetic block and are electrically connected to the ground layer, thereby successfully isolating the signal path of the contact block from the electromagnet block for reliable operation of the high frequency load circuit connected to the relay.

These and still other objects and advantageous features of the present invention will become more apparent from the following description of the embodiment when taken in conjunction with the attached drawings.

BRIEF DESCRIPTION OF THE DRAWINGS

FIG. 2 is a front view, partly in section, of a contact block of the device shown as surface-mounted on a printed board;

FIGS. 3 and 4 are top views of the contact block, respectively showing two contact operating positions;

FIG. 5 is an enlarged front view of a portion of the contact block;

DETAILED DESCRIPTION OF THE EMBODIMENTS

Figure 1:
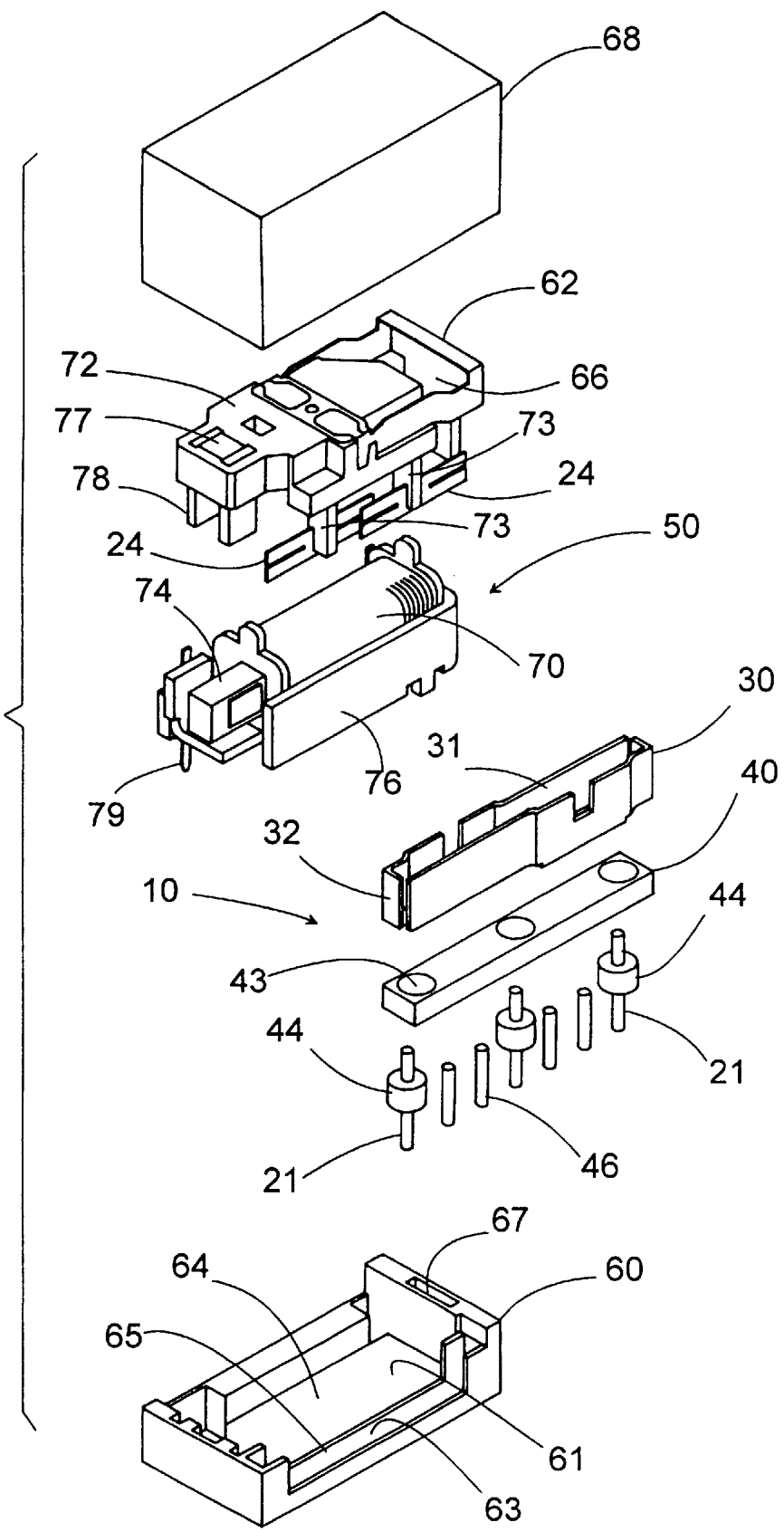
FIG. 1 is an exploded perspective view of a high frequency switching device in the form of an electromagnetic relay in accordance with a first embodiment of the present invention.

Referring now to FIG. 1, there is shown an electromagnetic relay as one typical switching device in accordance with a first embodiment of the present invention. The relay is in use mounted on a printed board 80 within a device operating on a high frequency current, for example, a portable cellular phone utilizing a high frequency signal of up to 3 GHz. The relay is composed of a contact block 10 and an electromagnet block 50. The contact block 10 includes a conductor base 40 carrying three horizontally spaced terminal pins 21 each defining a fixed contact 22 at its upper end, and a pair of movable contacts 24 each in the form of a spring leaf extending horizontally across the two adjacent fixed contacts 22. The terminal pins 21 is electrically insulated from the conductor base 40 by means of an insulation ring 44 of dielectric material fitted around an intermediate portion of the terminal pin 21. The center one of the fixed contacts 22 defines a common contact (COM), while the remaining two fixed contacts 22 define normally-open (NO) contact and normally-closed (NC) contacts, respectively. The movable contacts 24 are driven by the electromagnet block 50 to give two alternate contact positions, as shown in FIGS. 3 and 4. In one position, the left-hand movable contact 24 is spaced away from the two adjacent contacts 22 (NO) and (COM), while the right-hand movable contact 24 interconnects the two adjacent contacts 22 (COM) and (NC). In the other position, the above relation is reversed. Mounted on the conductor base 40 is an electromagnetic shield 30 which surrounds the fixed contacts 22 as well as the movable contacts 24 in order to isolate the current path between the contacts from the electromagnet block 50.

The electromagnet block 50 includes an excitation coil 70 secured to a casing 60 and an armature 72 which is movably supported by a return spring 62 to the casing 60. The armature 72 has a pair of props 73 of electrically insulating material each carrying the movable contact 24. Upon energization of the coil 70, the armature 62 is driven to move against the bias of the return spring 72 to move the movable springs 24 into position of FIG. 4. Upon deenergization of the coil 70, the armature 72 returns to the position of FIG. 3 by the action of the spring 62. The coil 70 is wound around a core 74 connected to a yoke 76 having two pole ends. The core 74 defines at its end a center pole which is cooperative with the respective pole ends to form individual magnetic gaps for receiving pole plates 78 at one end of the armature 72. A permanent magnet 77 is held between the pole plates 78 to give a magnetic circuit which holds the armature 72 in one position when the coil 70 is not energized, thereby giving a polarized mono-stable operation to the relay. The coil 70 has its opposite ends connected to coil terminals 79 which extend through the bottom of the casing 60 at portions remote from the coil block 10. The coil block 10 is received in a coil compartment 63 formed along one lateral end of the casing 60, while the electromagnet block 50 is received in a magnet compartment 64 separated from the coil compartment 63 by a partition 65. The coil compartment 63 has its bottom open so that the conductor base 40 is entirely exposed to the bottom of the casing 60.

In addition to the terminal pins 21, the base 40 carries a plurality of ground pins 46 for electrical connection of the base 40 to a ground conductor 81 formed on top of the printed board 80 on which the relay is mounted, as shown in FIG. 2. Through-holes 83 for the ground pins 46 are filled with solders for electrical connection to the ground conductor 81. Formed on the bottom of the printed board 80 is a conductor circuit 82 which constitutes a load circuit to be switched by the relay. The terminal pins 21 passing through corresponding through-holes 85 are soldered to corresponding lands of the conductor circuit 82 for electrical connection of the contact block 10 to the load circuit. The terminal pin 21 which is gold-plated has a diameter of about 0.40 mm and is insulated from the base 40 by the insulation ring 44 having a diameter (D) of about 1.35 mm. The insulation ring 44 is made of polybutaziene terephthalate (PBT) having a dielectric constant of about 3.1 to 3.4 and fits closely in a through-hole 43 of the base 40 over the full depth (d) of the base 40, as shown in FIG. 5. The depth (d) or the thickness of the base 40 is selected to be about 1.0 mm in order to minimize the bulk of the relay, yet retaining sufficient mechanical strength required. Also in this respect, diameter (D) of the insulation ring 44 is selected be minimum to for the miniaturization but at the same time for assuring sufficient isolation of the pins 21 from the base 40. With this dimensional requirements, the terminal pin 21 suffers from a considerable impedance reduction down to 29Ω at a first segment of the limited length of (d) surrounded by the insulation ring 44, when the pin is designed to have an optimum impedance of 50Ω in the absence of the insulation ring. That is, the reduced impedance Z at this first segment is known from the following equation:

$$Z = \frac{138}{\sqrt{\varepsilon_r}} \log \frac{D}{d}$$

where εr is a dielectric constant of the insulation ring 44.

The reduced impedance at this first segment of limited length (d) can be found to be successfully compensated for by an increased impedance at an immediately adjacent second segment provided that the second segment has a length L within about a hundredth of wavelength λ, i.e., λ/100 for the high frequency current. That is, for a high frequency current of 3 GHz, length L will be about 1.0 mm. Therefore, in order to compensate for the impedance reduction, the second segment of the limited length L of 1.0 mm or less is selected immediately above the base 40 and is made to have the increased impedance of about 70 to 80 Ω by the provision of a cut-out 34 in the lower end of the shield 30. With this result, the terminal pin 21 can have an optimum over-all impedance of about 50Ω over the entire length thereof. The shield 30 is shaped from an electrically conductive thin metal plate such as a Be—Cu alloy plate into a top-open rectangular box having opposed side walls 31, opposed end walls 32, and a bottom wall 33. The bottom wall 33 is opened at portions corresponding to the insulation rings 44 and is welded to the base 40. Thus, each of the cut-outs 34 immediately upward of the corresponding insulation ring 44 gives an open circumference around the second segment of each terminal pin 21, thereby increasing the impedance at the second segment to the above intended value.

Figure 6:
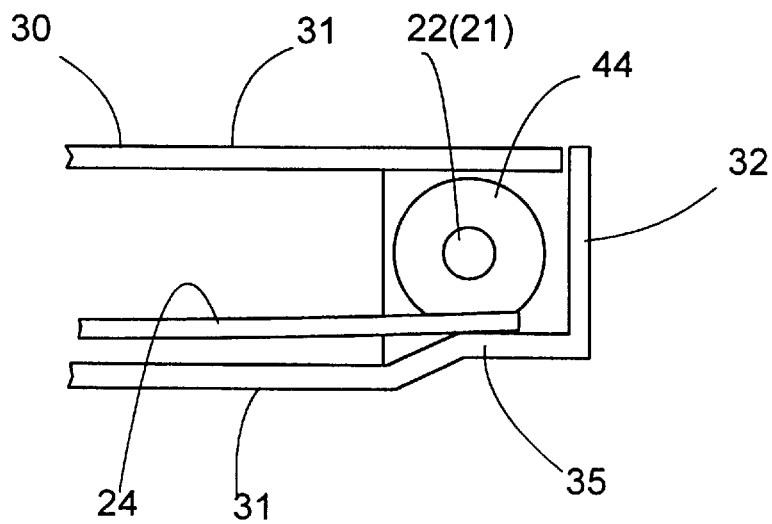
FIG. 6 is an enlarged top view of a portion of the contact block.

As shown in FIGS. 3 and 4, the side wall 31 of the shield 30 is partially bent inward to form flattened shoulders 35 on which the opposite longitudinal ends of the movable spring 24 rest when the movable contact is in the open position of being disconnected from the corresponding fixed contacts 22. The flattened shoulder 35 is shaped to have a close contact with the end of the movable contact 24 in the open position to leave no substantial gap between the distal end of the movable contact 24 and the shoulder 35, as best shown in FIG. 6. With this result, no such substantial capacitance is formed between the end of the movable contact 24 and the grounded shield 30 that would flow a ground current and bring about undesired antenna effect of breaking the isolation of the adjacent fixed contact 22 from the grounded shield 30 when the associated movable contact 24 is in the open position. In other words, the end of the movable contact 24 can be prevented from making a floating electrode adjacent the fixed contact and can be successfully maintained at the ground level.

The casing 60 is molded from a dielectric plastic material and is deposited with a ground layer 61 on its interior, for example, the bottom of the magnet compartment 64. Electrically connected to the ground layer are the metal components of the electromagnet block 50 which include the core 74, the yoke 76, and the return spring 62. The return spring 62 is connected to an end plate 66 also of metal conductor which is inserted into a mount hole 67 in the end of the casing 60. The mount-hole 67 is formed on its interior with a like ground layer which may be electrically interconnected to the ground layer on the bottom of the casing 60. Thus, all the metal components forming the electromagnet block 50 are grounded so as to improve isolation of the contact block 10 from the electromagnet block. The casing may be also formed on its exterior with another ground layer. A cap 68 which fits over the casing 60 to enclose all the parts of the relay therebetween is molded from a dielectric plastic material and may be deposited on either interior or exterior surface with a like ground layer for isolation of the relay from an external electromagnetic field.

Figure 7:
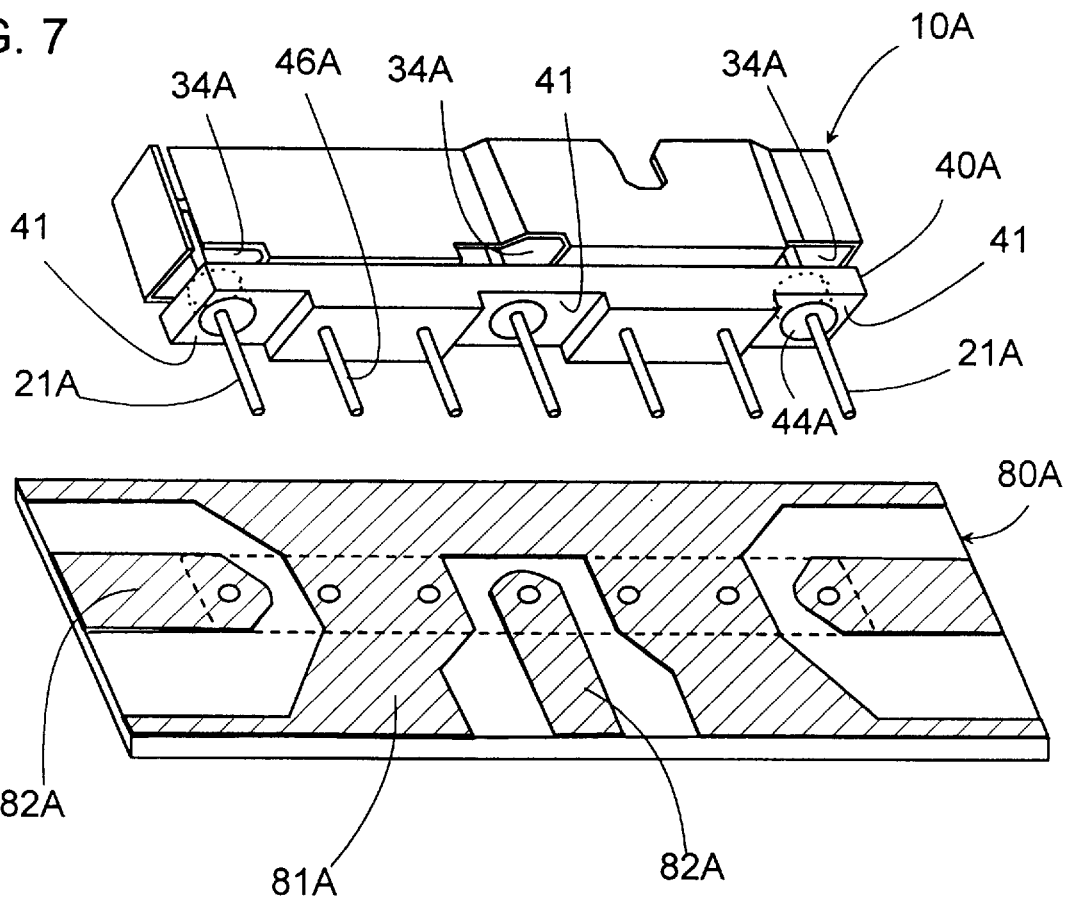
FIG. 7 is an exploded perspective view of a contact block utilized in a high frequency switching device in accordance with a second embodiment of the present invention.
Figure 8:
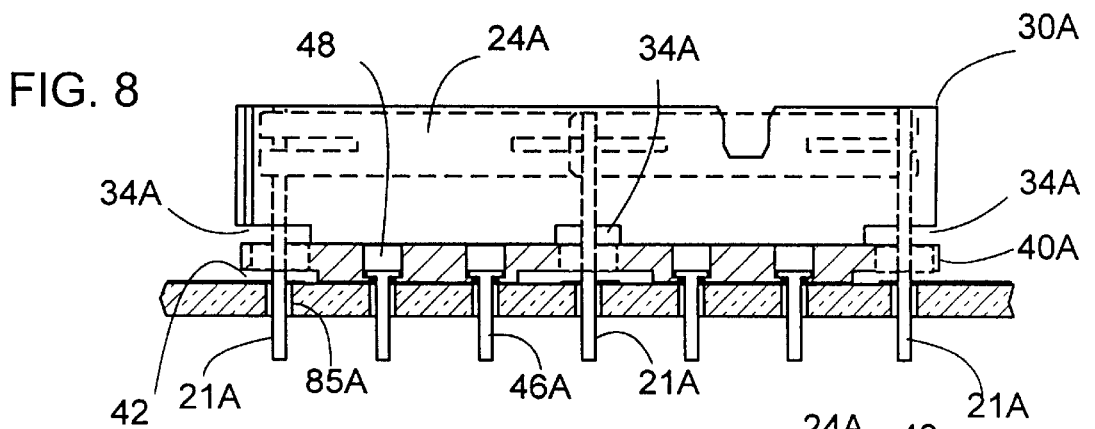
FIG. 8 is a front view, partly in section, of the contact block surface-mounted on a printed board.
Figure 9:
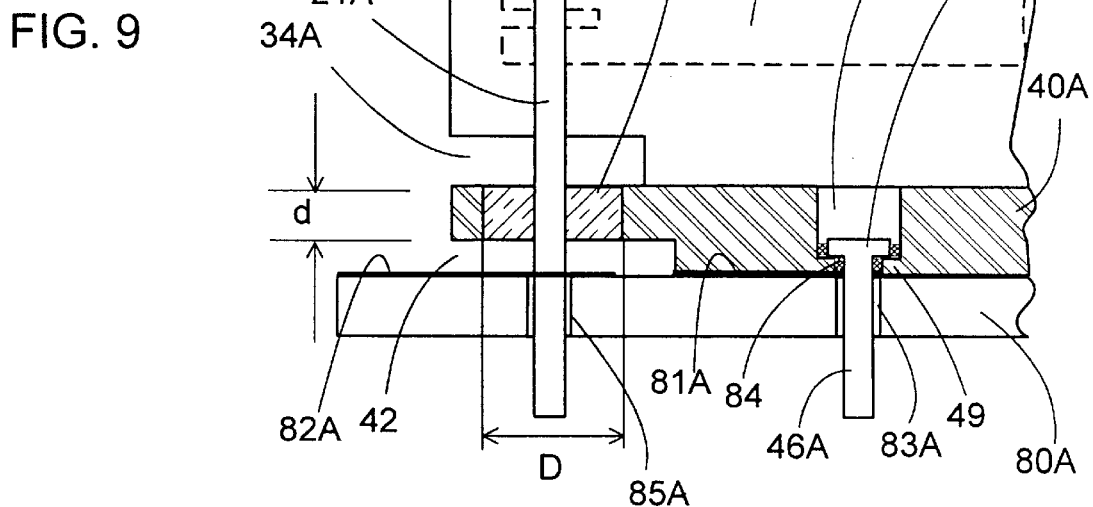
FIG. 9 is an enlarged front view of a portion of the contact block.

Referring now to FIGS. 7 to 9, there is shown a contact block 10A which may be equally utilized in the above relay. The contact block 10A in accordance with a second embodiment of the present invention is substantially identical to the previous embodiment except that a conductor base 40A is formed in its bottom with recesses 41 around the terminal pins 21A. Like parts are designated by like numerals with a suffix letter of "A". The portions of the base 40A other than the recesses 41 define first surfaces on the bottom of the base for direct contact upon a printed board 80A. While, the recesses 41 define on their bottoms second surface which is spaced away from the printed board 80A to thereby give individual clearances 42 between conductors 82A on top of the printed board 80A and the base 40A. Thus, the terminal pins 21A are allowed to be soldered to the conductors 82A on the top side of the printed board 80A by solder filled in corresponding through-holes 85A. Because of the provision of the recesses 41, the conductor circuit 82A can be formed on top of the printed board to keep an point of electrical connection of the pin 21A to the conductor 82A at the top of the printed board, which eliminate a possibility of extending a current path to a segment of the pin 21A where it is surrounded by the printed board 80A and therefore avoids the otherwise undesired impedance reduction at such segment. Further, the recess 41 may be utilized to compensate for the impedance reduction at the segment surrounded by the insulation ring 44A either alone or in combination with the cut-out 34A of the shield 30A.

As shown in FIGS. 8 and 9, each of the ground pins 46A has an enlarged head 47 which is engaged with an inner flange 49 at the lower end of the through-holes 48. Solder 84 is filled in the through-holes 48 from the bottom of the printed board to occupy the gap between the pin and the inner flange. By application of heat the solder 84 is melted to secure the pin 21A to the base 40A as well as to the ground conductor 81A on top of the printed board.

Figure 10:
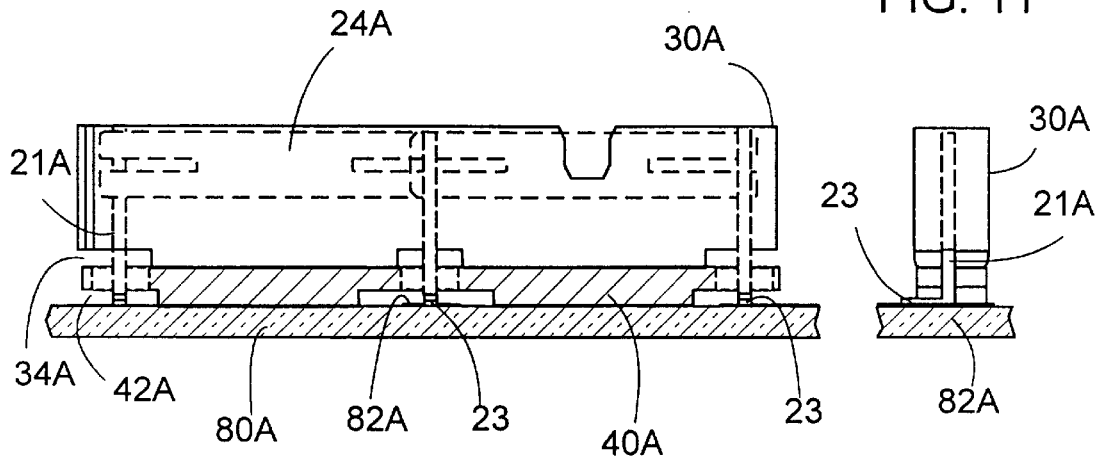
FIG. 10 is a front view, partly in section, of a modified contact block mounted on a printed board.
Figure 11:
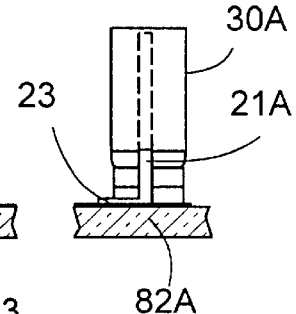
FIG. 11 is a side view of the modified contact block of FIG. 10.
Figure 12:
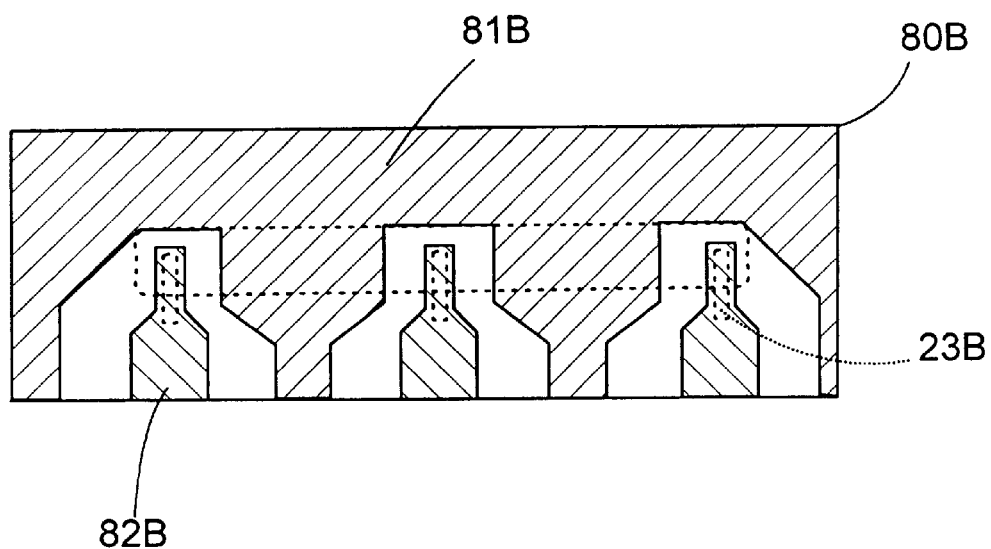
FIG. 12 is a top view of a printed board utilized in association of the contact block of FIG. 10.
Figure 13:
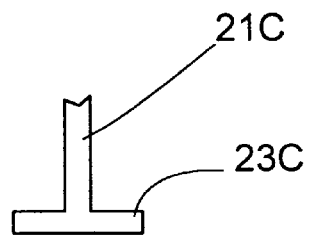
FIG. 13 is a schematic view showing a portion of a terminal pin which may be alternatively utilized in the contact block of FIG. 10.

As shown in FIGS. 10 to 12, the terminal pin 21B may be shaped to have bent foot 23 which is placed upon corresponding conductors 82B on the printed board 80B for soldering connection thereto. The terminal pin 21C may be further shaped to have a T-shaped foot 23C, as shown in FIG. 13.

What is claimed is:

1. A high frequency switching device including a contact block, said contact block comprising:
   at least one pair of fixed contacts each formed on one end of terminal pins;
   a movable contact which is driven to close and open a path between said fixed contacts;
   a conductor base of electrically conductive material having insulation rings each passing through each one of said terminal pins to locate said fixed contacts upwardly of said conductor base in an electrically insulating relation thereto, said terminal pins and said movable contact being cooperative to define a signal path flowing a high frequency current;
   an electromagnetic shield upstanding from said conductor base to enclose said fixed contacts and said movable contact, said shield being electrically connected to said conductor base;
   wherein said contact block includes an impedance compensating means for differentiating a first impedance at a first segment of a limited length along said terminal pin from a second impedance inherent to a second segment of a limited length aligned immediately adjacent to said first segment along said terminal pin so as to give a target over-all impedance, which is between said first and second impedance, over the full length of each said terminal pin.

2. The high frequency switching device as set forth in claim 1, wherein said first segment and said second segment have said limited length not greater than a hundredth of wavelength $\lambda(\lambda/100)$ for said high frequency current.

3. The high frequency switching device as set forth in claim 1, wherein said electromagnetic shield has side walls which enclose therebetween said fixed contacts as well as said movable contact, said side walls being shaped from a metal sheet of uniform thickness and formed at portions respectively adjacent said fixed contacts with flattened shoulders on which opposite ends of said movable contact rest when said movable contact is in an open condition of being away from said fixed contacts, each of said flattened shoulders being shaped by partially deforming said side wall inwardly over a limited length in parallel with said movable contact so that said movable contact has its opposite ends in constant contact with said shoulders over substantially the entire horizontal length thereof when said movable contact is in said open condition.

4. The high frequency switching device as set forth in claim 1, including an electromagnet block carrying an excitation coil and an armature which is coupled to said movable contact to open and close the movable contact from and to the fixed contacts upon energization of said excitation coil, said device further including a casing for receiving said electromagnet block as well as said contact block, said casing being molded from an electrically insulating plastic material and deposited thereon with a ground layer of electrically conductive material, said electromagnetic block including parts of electrically conductive material which are exposed on said electromagnetic block and are electrically connected to said ground layer.

5. The high frequency switching device as set forth in claim 1, wherein said impedance compensating means is defined by a cut-out which is formed in said shield immediately adjacent to said conductor base to give open windows located around said terminal pin for increasing the first impedance at said first segment corresponding to said cut-outs than said second impedance.

6. The high frequency switching device as set forth in claim 5, wherein said second segment of the terminal pin is totally surrounded by said insulation ring over said limited length to be thereby given said second impedance.

7. The high frequency switching device as set forth in claim 6, wherein said conductor base is formed with through-holes into each of which said insulation ring fits snugly with upper and lower surfaces of said insulation ring being in flush with said upper and lower surfaces of said conductor base, said conductors base having a thickness (d) which is smaller than a diameter (D) of said insulation ring.

8. The high frequency switching device as set forth in claim 1, wherein said conductor base has first and second lower surfaces of different levels, said first lower surface being adapted in use to be surface mounted on a printed board so as to be electrically connected to a ground conductor on top of said printed board, said second lower surfaces through which said terminal pins extend respectively being in a level higher than said first lower surface so as to form a clearance between said second lower surface and said printed board, enabling said terminal pins to be soldered on a conductor circuit on top of said printed board.

9. The high frequency switching device as set forth in claim 8, wherein said terminal pin is formed at its lower end with a flattened foot which is adapted in use to abut on said conductor circuit of said printed board for soldering connection therewith.

10. The high frequency switching device as set forth in claim 8, wherein said conductor base carries a plurality of ground pins for connection with said ground conductor on said printed board, each of said ground pins being formed at its upper end with an enlarged head and extending through a corresponding through-hole in said conductor base with said enlarged head engaged with an inner flange at the lower end of said through-hole, said enlarged head being secured to said inner flange by a solder filled in the through-hole at a portion adjacent to the inner flange.

* * * * *